United States Patent
Turner (10) Patent No.: US 8,940,572 B2
(45) Date of Patent: Jan. 27, 2015

(54) METHOD FOR FORMING STRUCTURES IN A SOLAR CELL

(75) Inventor: Adrian Turner, Palo Alto, CA (US)

(73) Assignee: Tetrasun, Inc., Saratoga, CA (US)

( * ) Notice: Subject to any disclaimer, the term of this patent is extended or adjusted under 35 U.S.C. 154(b) by 108 days.

(21) Appl. No.: 13/265,438

(22) PCT Filed: Apr. 21, 2010

(86) PCT No.: PCT/US2010/031874
§ 371 (c)(1),
(2), (4) Date: Nov. 15, 2011

(87) PCT Pub. No.: WO2010/123976
PCT Pub. Date: Oct. 28, 2010

(65) Prior Publication Data
US 2012/0055546 A1 Mar. 8, 2012

Related U.S. Application Data

(60) Provisional application No. 61/171,187, filed on Apr. 21, 2009.

(51) Int. Cl.
| | |
|---|---|
| *H01L 21/00* | (2006.01) |
| *H01L 31/00* | (2006.01) |
| *B23K 26/36* | (2014.01) |
| *B23K 26/06* | (2014.01) |
| *B23K 26/073* | (2006.01) |
| *B23K 26/08* | (2014.01) |

(52) U.S. Cl.
CPC ............. *B23K 26/36* (2013.01); *B23K 26/0656* (2013.01); *B23K 26/073* (2013.01); *B23K 26/083* (2013.01)
USPC ................. 438/71; 136/256; 438/72

(58) Field of Classification Search
None
See application file for complete search history.

(56) References Cited

U.S. PATENT DOCUMENTS

| | | | |
|---|---|---|---|
| 5,010,040 | A | 4/1991 | Vayman |
| 6,429,037 | B1 | 8/2002 | Wenham et al. |
| 6,662,439 | B1 | 12/2003 | Bhullar |

(Continued)

FOREIGN PATENT DOCUMENTS

| | | | |
|---|---|---|---|
| EP | 1 816 683 A | | 6/2007 |
| JP | 59-084477 A | | 5/1984 |

(Continued)

OTHER PUBLICATIONS

Henry at el.: Laser Direct Write of Active Thin-Films on Glass for Industrial Flat Panel Display Manufacture,JLMN vol. 2, No. 1 (2007) pp. 49-56.*

(Continued)

*Primary Examiner* — Mark Tornow
*Assistant Examiner* — Priya Rampersaud
(74) *Attorney, Agent, or Firm* — Kevin P. Radigan, Esq.; Heslin Rothenberg Farley & Mesiti P.C.

(57) ABSTRACT

A conductive contact pattern is formed on a surface of solar cell by forming a thin conductive layer over at least one lower layer of the solar cell, and ablating a majority of the thin conductive layer using a laser beam, thereby leaving behind the conductive contact pattern. The laser has a top-hat profile, enabling precision while scanning and ablating the thin layer across the surface. Heterocontact patterns are also similarly formed.

32 Claims, 6 Drawing Sheets

(56) References Cited

U.S. PATENT DOCUMENTS

| | | |
|---|---|---|
| 8,455,754 B2 | 6/2013 | Niira et al. |
| 2002/0119592 A1 | 8/2002 | Oswald et al. |
| 2004/0177878 A1 | 9/2004 | Maruyama |
| 2007/0169806 A1 | 7/2007 | Fork et al. |
| 2008/0057718 A1* | 3/2008 | Omata et al. ............ 438/694 |
| 2008/0070393 A1 | 3/2008 | Miyairi et al. |
| 2009/0213446 A1* | 8/2009 | An et al. ............ 359/212.1 |
| 2010/0009094 A1 | 1/2010 | Lochtman et al. |
| 2010/0029039 A1* | 2/2010 | Shan et al. ............ 438/98 |
| 2010/0037941 A1* | 2/2010 | Borland et al. ............ 136/255 |
| 2010/0055901 A1* | 3/2010 | Zhang et al. ............ 438/669 |
| 2010/0243041 A1* | 9/2010 | Carlson et al. ............ 136/255 |
| 2012/0024368 A1* | 2/2012 | Sauar et al. ............ 136/256 |
| 2012/0227804 A1* | 9/2012 | Ko et al. ............ 136/256 |
| 2013/0042913 A1* | 2/2013 | Crafts et al. ............ 136/256 |

FOREIGN PATENT DOCUMENTS

| | | |
|---|---|---|
| JP | 59-117276 A | 7/1984 |
| JP | 09-293891 A | 11/1997 |
| JP | 2006-286821 A | 10/2006 |
| JP | 2008-172026 A | 7/2008 |
| JP | 2008-238195 A | 10/2008 |
| JP | 2009-21358 A | 1/2009 |
| WO | 03/061013 A1 | 7/2003 |

OTHER PUBLICATIONS

International Search Report for PCT/US2010/031874 dated Jun. 29, 2010.

* cited by examiner

METHOD FOR FORMING STRUCTURES IN A SOLAR CELL

RELATED APPLICATION INFORMATION

This Application is a National Stage filing under section 371 of International Application No. PCT/US2010/031874, filed 21 Apr. 2010, and this Application claims the benefit of previously filed U.S. Provisional Application entitled "Method for Forming Structures in a Solar Cell," filed 21 Apr. 2009 and assigned application No. 61/171,187; and is related to the commonly-assigned, previously filed U.S. Provisional Application entitled "High-Efficiency Solar Cell Structures and Methods of Manufacture," filed 21 Apr. 2009 and assigned application No. 61/171,194; and to commonly-assigned, co-filed International Patent Application entitled "High-Efficiency Solar Cell Structures and Methods of Manufacture" filed as and assigned application number PCT/US2010/031869. Each of these Applications is hereby incorporated by reference herein in its entirety. All aspects of the present invention may be used in combination with any of the disclosures of the above-noted Applications.

TECHNICAL FIELD

The present invention relates to solar cells. More particularly, the present invention relates to improved solar cell structures and methods of their manufacture.

BACKGROUND OF THE INVENTION

The formation of metalized structures, typically fingers and bus-bars, on the front (illuminated) side of solar cells is a necessary step in many cell designs. It is typically desirable that these structures be as fine (minimal width) as possible to minimize shading and contact recombination losses. Heterocontact structures which can be subsequently metalized may also be used to reduce contact recombination losses.

SUMMARY OF THE INVENTION

The present invention addresses these requirements and others by providing a method for the formation of front/back side metal structures and selective heterocontact structures.

The present invention in one aspect comprises a method of forming a conductive contact pattern on a surface of solar cell, including forming a thin conductive layer over at least one lower layer of the solar cell, and ablating a majority of the thin conductive layer using a laser beam, thereby leaving behind the conductive contact pattern. A self-aligned metallization may be formed on the conductive contact pattern.

The lower layer may include a passivation and/or antireflective layer beneath the thin conductive layer, wherein the conductive contact pattern forms an electrical contact through the at least one lower layer to a semiconductor layer of the solar cell.

Etching or cleaning the conductive contact pattern may be used after ablating to remove residue.

In another aspect, the present invention comprises a method of forming a heterocontact pattern on a solar cell, including forming a thin layer over at least one lower layer of the solar cell; and ablating a majority of the thin layer using a laser beam, thereby leaving behind the heterocontact pattern. Metallization may be formed over the heterocontact pattern to facilitate a conductive connection to the at least one lower layer through the heterocontact pattern.

The thin layer may comprise multiple, different layers.

Etching the surface of the solar cell after ablating may be used to form a surface texture and/or to remove any laser ablation damage. The heterocontact pattern may be modified by in-situ heat treatment.

All or part of the thin layer may include a doped semiconductor material or a surface passivation layer.

The laser beam may have a top hat beam profile, and be projected through a mask. The laser beam shape created by the mask may be a regular polygon, possibly obstructed by a thin line running across the polygon. Multiple masks or a dynamically changing mask may be used.

The laser may be operated at a wavelength and pulse width at which laser energy is strongly absorbed in the thin conductive layer and weakly absorbed in the at least one lower layer. In one embodiment, more than 80% of the surface area of the thin conductive layer is ablated, and the structures remaining after said ablating are in the pattern of contact fingers and/or busbars.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in combination with the accompanying drawings in which:

DETAILED DESCRIPTION OF THE INVENTION

The present invention provides, in one aspect, a manufacturing approach for the production of solar cell structures using negative laser ablation to form line structures on the front (and/or rear) face of a solar cell, resulting in very fine features which minimize interference with incident light and provide other advantages.

Cell structuring is performed by, e.g., laser direct write using mask (or mask-less) projected "top hat" homogenous beam profiles such that a negative of the required line pattern is "written" or ablated, by an incident laser. Homogeneous top hat profiles allow for controlled thin film ablation with minimal pattern overlap and high resolution. Such patterning is not typically possible with gaussian beam profile systems.

Figure 1:
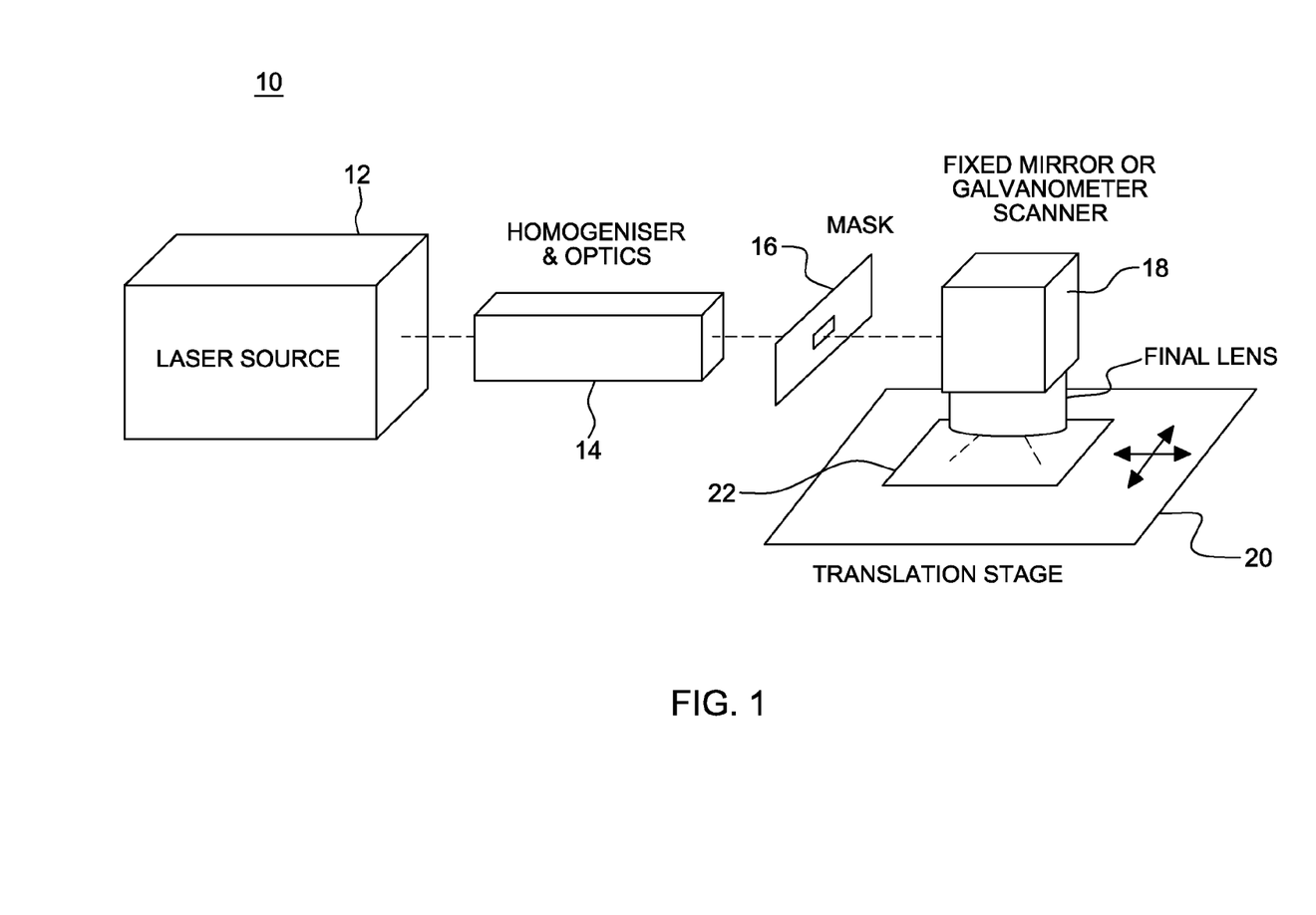
FIG. 1 is a functional block diagram of the main components of a laser machining system, in accordance with an aspect of the present invention.

FIG. 1 is a functional diagram showing the main components of a system for performing laser ablation using masked, projected top hat homogenous beam profiles. This exemplary system 10 includes a laser source 12, homogenizer and optics 14, mask 16, scanner 18 (including a lens in one embodiment), and translation stage 20 for holding a solar cell 22 requiring ablation.

The formation of top-hat laser profiles (e.g., known to be a controlled flat top profile rather than Gaussian) can be effected using very high power (>300 W) lasers combined with homogenizers, masks, mirrors, translation stages and/or scanners to enable full area exposure and direct writing of repetitive features, with the machined features being defined by the mask, translation stage, and/or scanner. Laser sources used may be high power multimode sources. The laser source wavelength, pulse width, repetition rate, and pulse energy are chosen to best suit the process requirements. Examples of such laser sources include diode pumped solid state Nd:YAG and Excimer lasers. Other examples include pulsed (Q-Switched) lasers or continuous wave lasers. The laser may be operated at a wavelength and pulse width at which laser energy is strongly absorbed in the thin film layer and weakly absorbed in the semiconductor substrate, to effect ablation of the upper layer.

The exact size and shape of the projected beam which writes the pattern is determined by the system optics and the mask to match the process requirements. In general, and without limitation, the laser beam shape created by the mask may be any regular polygon, possibly obstructed by a thin line running across the polygon. Multiple masks or a dynamically changing mask may be used to process a single solar cell. The laser may be a pulsed laser, have a top hat beam profile, process an area with a single laser pulse, where the overlap of the scanned beam is less than 20% of the single pulse processing area. In accordance with the invention, more than 80% of the surface area of the upper thin film later may be ablated, leaving behind the requisite fine pattern.

Figure 2A:
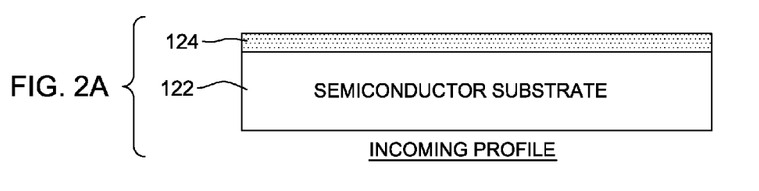
FIGS. 2a-d depict solar cell structuring using a square/rectangular top-hat beam profile in accordance with an aspect of the present invention.
Figures 2B, 2C:
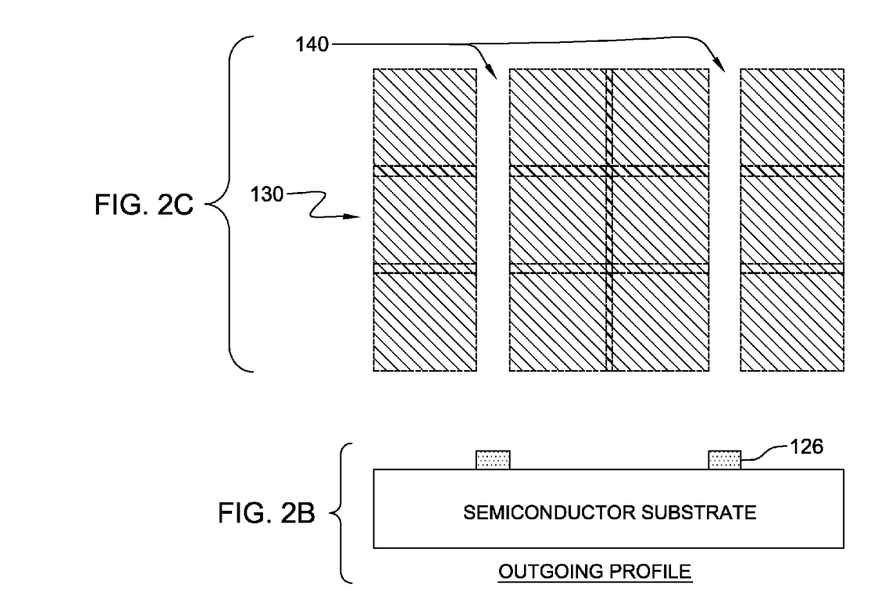
Figure 2D:
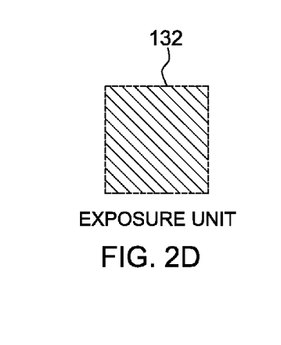
Figure 3A:
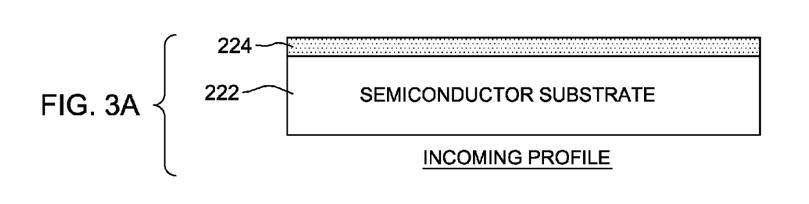
FIGS. 3a-d depict solar cell structuring using a square-with-line top-hat beam profile in accordance with an aspect of the present invention.
Figures 3B, 3C:
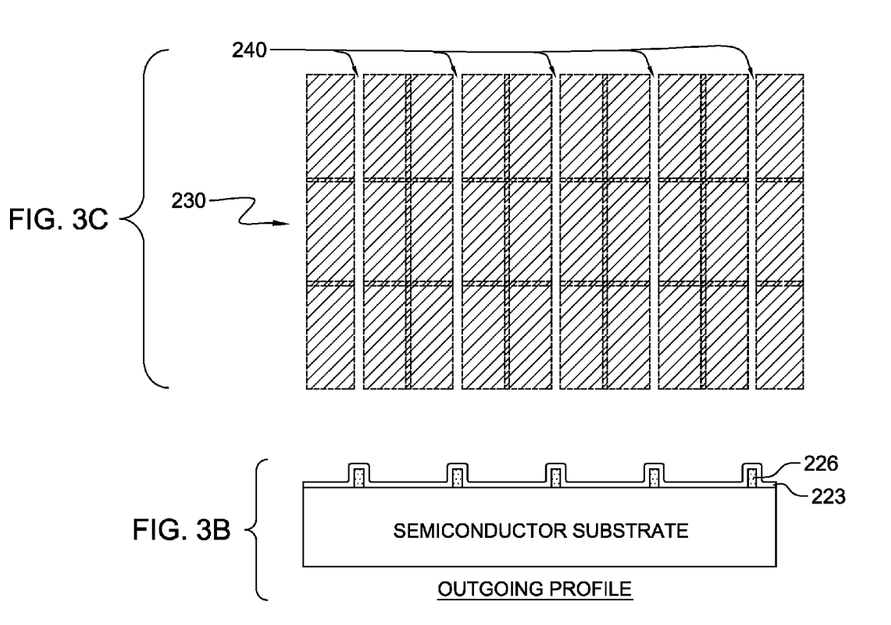
Figure 3D:
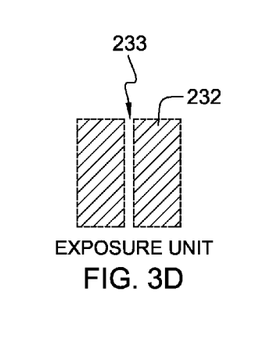

Two exemplary shapes and scanning patterns which can be used to remove a thin film from the majority front of a solar cell are shown in FIGS. 2 and 3 in accordance with the present invention.

As one example, FIGS. 2a-d show a simple square or rectangle exposure unit 132 (FIG. 2d) which is moved along translation pattern 130 (FIG. 2c). The fine structure in the resultant thin film 126 is formed by negative laser ablation during appropriate translation of the beam and/or solar cell relative to each other. More particularly, a substrate 122 (shown in side view of FIG. 2a—and possibly including other layers) has formed thereon a thin film layer 124 requiring ablation. The laser exposure unit 132 is translated/stepped/scanned in a planar translation pattern 130 (FIG. 2c) over the film, avoiding areas 140, resulting in a finely patterned structure 126 (FIG. 2b).

As another example, FIGS. 3a-d show a square or rectangle exposure unit 232 (FIG. 3d) which has a central blocked segment 233 in the mask which is moved along translation pattern 230 (FIG. 3c). This blocked segment can be used to form the fine structure 226 in the thin film by negative ablation. More particularly, a substrate 222 (shown in side view of FIG. 3a—and possibly including other layers) has formed thereon a thin film layer 224 requiring ablation. The laser exposure unit 232 with blocked area 233 is translated/stepped/scanned in a planar translation pattern 230 (FIG. 3c) over the film, blocking areas 240, resulting in a finely patterned structure 226 (FIG. 3b). In one embodiment, a passivation and/or antireflective layer 223 (FIG. 3b) may be formed on the surface of the resultant structure.

Figure 4A:
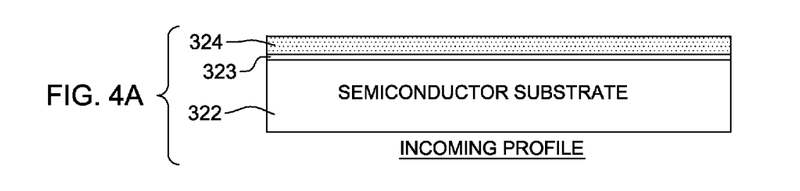
FIGS. 4a-e depict solar cell structuring using combining two different mask shapes in accordance with an aspect of the present invention.
Figure 4B:
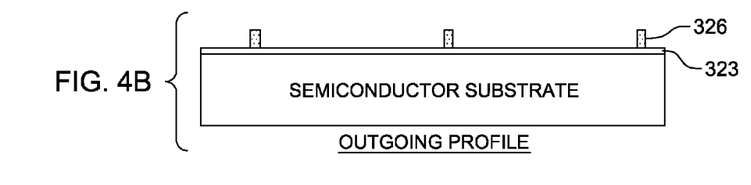
Figure 4C:
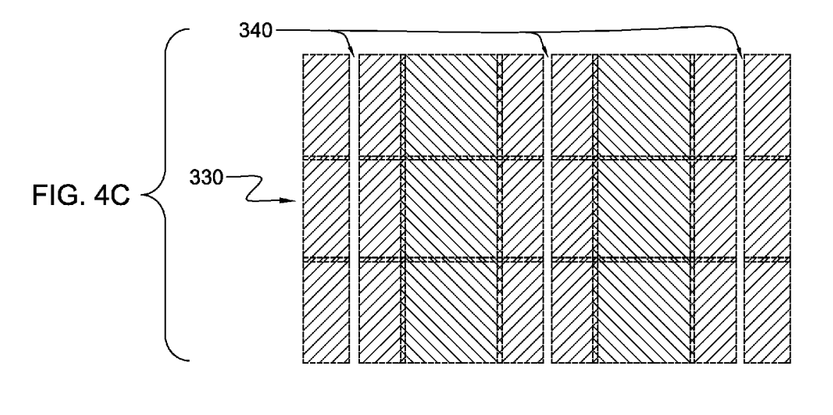
Figure 4D:
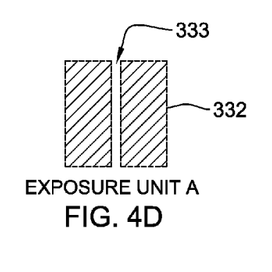
Figure 4E:
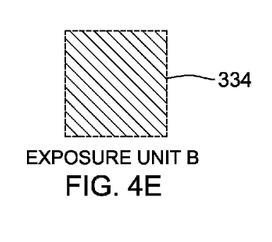

The exposure unit shapes illustrated in FIGS. 2d and 3d can be combined into a single laser scan sequence, as shown in FIGS. 4a-e. More particularly, a substrate 322 (shown in side view of FIG. 4a—and possibly including other layers, such as, in this embodiment, a passivation and/or anti-reflective layer 323) has formed thereon a thin film 324 requiring ablation. The laser exposure unit 332 with blocked area 333 (FIG. 4d), and also rectangular pattern 334 (FIG. 4e), are translated/stepped/scanned in a planar translation pattern 330 (FIG. 4c) over the film, avoiding areas 340, resulting in a finely patterned structure 326 (FIG. 4b). Very rapid changing of the mask shapes 332 and 334 may be achieved by, for example, using a high speed galvanometer which inserts a beam blocking element at (or very close to) the plane of the mask. Therefore, transition between the shapes shown in FIGS. 2 and 3 may be done very quickly (in milliseconds) without adversely affecting the overall processing time. Such dynamic mask changing techniques can be synchronized with beam and/or stage translations to provide more flexibility in the types of patterns which can be economically produced.

Figure 5:
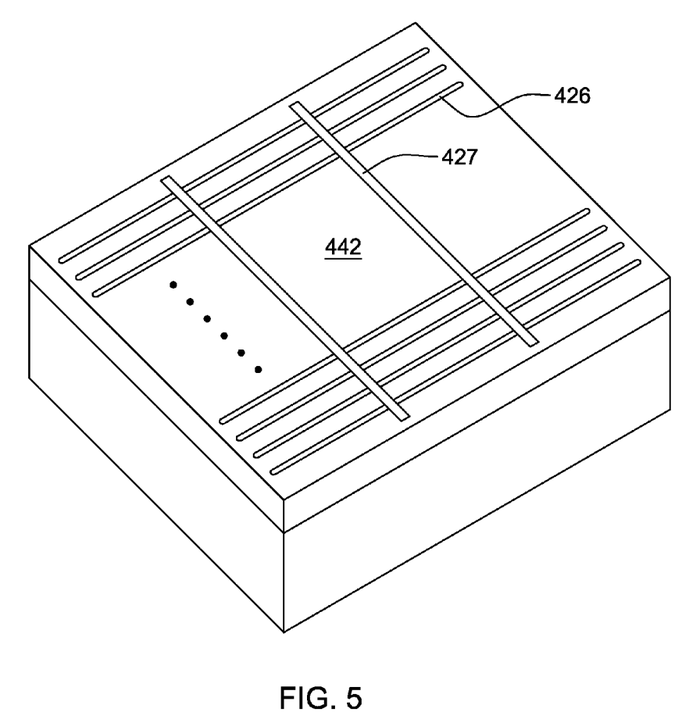
FIG. 5 depicts a completed finger/bus-bar structure on the front face of a solar cell created according to an aspect of the present invention.

FIG. 5 shows a solar cell 422 having a pattern of fingers 426 and bus bars 427 on a surface thereof, formed in accordance with any of the above-described aspects of the present invention. The resulting structures can be very fine (<10 um line width). The minimum pattern resolution is nominally defined by the optical resolution of the system. With this technique many types of thin films may be cost effectively patterned to form solar cell structures. As an example consider a thin film with an ablation threshold of 3 $J/cm^2$. A 300 W laser source would be capable of patterning the entire area of a 250 $cm^2$ solar cell in as little as 2.5 seconds. Such high throughput supports the demanding economics of solar cell production.

One improvement involves using any form of texture on the substrate (122, 222, 322) where this texture is of a scale comparable to that of spatial inhomogeneities present in the intensity profile of the top hat laser beam. Such texture provides an important beam-homogenizing function—as it is generally desirable to operate the laser beam with a fluence at or close to the ablation threshold of the layer (124, 224, 324) and hence, a locally homogenized beam adds a greater deal of control and precision.

The present invention has been described as applying to the front, light receiving, surface of a solar cell but can be equally applied to structures on the rear surface. Application of the invention to both sides of a solar cell will result in a bifacial solar cell which could be capable converting photons incident on both front and rear surfaces.

With reference to the above figures, the present invention provides a method for forming, e.g., contact metallization or other fine structures in a solar cell, the method including the steps of:

A1) On the front (or back) surface of a solar cell (e.g., semiconductor substrate) a continuous thin film metal layer (124, 224, 324) is deposited, the metal film material and thickness being selected such that it has desirable adhesion, contact resistance, plating and laser ablation properties. Examples of metals or metal alloys which may have suitable properties include: nickel, nickel-vanadium, nickel-niobium, nickel-tantalum, aluminum, aluminum-silicon, chromium, titanium, silver and tungsten.

A2) By laser ablation the thin film metal layer is removed from the majority of the front surface leaving behind structures (126, 226, 326) for example fingers or busbars, which can form the front contact metallization for the solar cell.

A3) Self-aligned metallization of these thin film metal structures can optionally be performed. Nominally this is done to reduce series resistance losses. Typically this metallization is performed by selective electroplating, light-induced-plating and/or electroless plating onto the existing thin film metal structures.

In addition to the steps A1) to A3) listed above, many variations and additions are possible in accordance with the present invention. For example after step A2) a chemical clean may be performed to remove any residual metal. Further a thermal anneal step may be performed prior to self-aligned metallization in step A3). In some embodiments, surface passivation and/or anti-reflective layers can be deposited on the solar cell prior to deposition of the thin film metal layer in step A1). Such passivation and anti-reflection layers could allow, or be modified in-situ, for electrical contact with the underlying semiconductor substrate. Alternatively or further in some embodiments surface passivation and/or antireflective layers may be deposited on the solar cell at some stage after final metallization in step A3).

Another improvement involves the use of multi-layered metal as the thin layer (124,224,324). A single metal (or metal-alloy) layer may not provide optimal process or solar cell device performance. By using a multi-layered metal stack different metal properties may be exploited to provide better performance. For example in a two layer metal stack it is desirable that the bottom metal (next to substrate 122, 222, 322) have a low ablation threshold while the top metal be compatible with subsequent self aligned metallization steps (A3). An example of such a stack could be Ni as a top metal over Ti as a bottom metal.

With reference to the above figures, another embodiment of the present invention involves a method for forming selective heterocontact (or as could otherwise more generally be described as selective emitter) structures in a solar cell, the method includes the steps of:

B1) On the front surface of a semiconductor substrate a continuous thin film layer (124, 224, 324) is deposited. This thin film layer may consist of multiple stacked films, the film stack being designed with desirable contact resistance, contact recombination, series resistance, laser ablation, adhesion and etch resistance properties. Films used in this stack may include:
doped semiconductor films such as polycrystalline or amorphous silicon, silicon, polycrystalline or amorphous silicon-carbide, polycrystalline or amorphous diamond-like-carbon; and/or
undoped films such as silicon oxide, silicon nitride, intrinsic amorphous silicon, intrinsic polycrystalline silicon, aluminum oxide, aluminum nitride, phosphorus nitride, titanium nitride, intrinsic amorphous silicon carbide, intrinsic polycrystalline silicon carbide.

B2) By laser ablation the thin film layer is removed from the majority of the front surface leaving behind structures (126, 226, 326), for example fingers and bus-bars. These structures can subsequently be metalized.

B3) The front surface of the cell may be etched to form a surface texture and/or to remove any laser ablation damage, the laser patterned thin film structures having been designed to be resistant to this etch will remain.

B4) Self-aligned metallization of these thin film structures may be performed. Typically this metallization is performed by selective electroplating, light-induced-plating, and/or electroless plating onto the existing thin film structures.

In addition to the steps B1) to B4) listed above, many variations and additions are possible. For example after step B3) a dopant diffusion and/or thermal oxidation may be performed in order to form an emitter and/or effectively passivate the front surface of the cell. This has the additional advantage that the thermal oxide can aid in the selective plating of thin film structures. Another variation may involve the addition of a thermal treatment after step B2) to change properties, such as etch resistance, of the thin film layer. Typically in all schemes an anti-reflection and/or additional passivation layer may be deposited at some stage after final metallization in step B4).

The invention can be applied to many solar cell structures, including any of those listed in the above-incorporated Patent Applications. The following are merely examples, but the invention is not limited to these examples.

Example 1

Figure 6A:
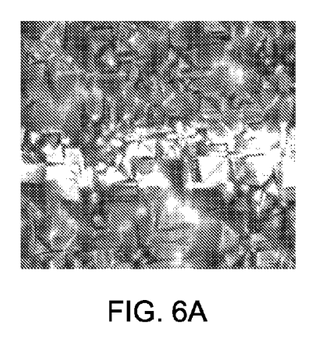
FIGS. 6a-b show an exemplary Ti solar cell finger in accordance with the present invention.
Figure 6B:
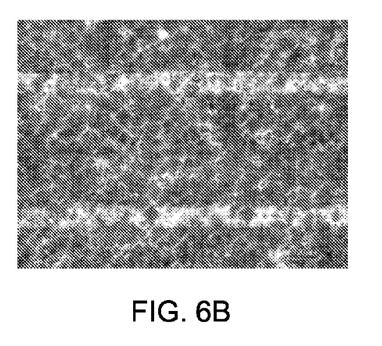

A thin layer of Titanium metal is ablated from a passivated and random pyramid textured mono-crystalline silicon wafer to form thin metal fingers. Titanium is deposited on the front of the wafer by physical vapor deposition to a thickness of approximately 500 Å. This metal is ablated from the majority of the wafer surface to leave behind thin metal fingers with a width of approximately 50 μm. Such metal ablation can be performed using an Nd:YAG laser. When such a laser is imaged through a mask and a top-hat (or pseudo top-hat) profile created then single shot ablation with minimal shot overlap (<20%) can be used to create fine line metal features which form the finger and bus-bar pattern of the solar cell. In this example an industrial laser system capable of delivering 140 W to the sample can process a 250 $cm^2$ solar cell in approximately 4 sec. Further it can be shown, by cell lifetime measurements before and after laser ablation, that the required operating fluence is below the damage threshold of the cell passivation. An exemplary solar cell finger created by this large area laser ablation is depicted in FIGS. 6a-b.

Example 2

Figure 7:
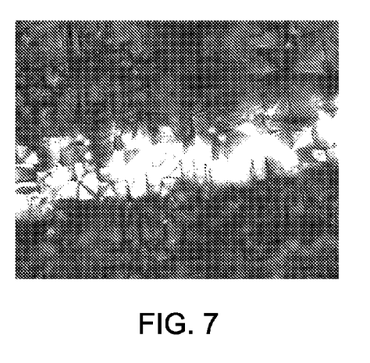
FIG. 7 shows an exemplary Ni solar cell finger in accordance with the present invention.
Figure 8A:
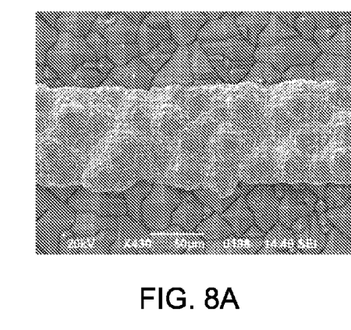
FIGS. 8a-b show exemplary self-aligned metallization of the finger of FIG. 7.
Figure 8B:
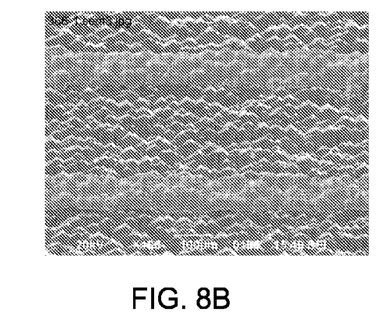

A thin layer is Nickel-7% Vanadium metal alloy is ablated from a passivated and random pyramid textured mono-crystalline silicon to form thin metal fingers. Ni (7% V) is deposited by physical vapor deposition and to a thickness of approximately 500 Å. This metal is ablated from the majority of the wafer surface to leave behind thin metal fingers with a width of approximately 50 μm. Such metal ablation can be performed using an Nd:YAG laser. When such a laser is imaged through a mask and a top-hat (or pseudo top-hat) profile created then two shot per area can be used to create fine line metal features which form the finger and bus-bar pattern for a solar cell. Further such a patterned nickel film can directly act as a suitable seed layer for self-aligned metallization. Such metallization of the patterned nickel seed can, for example, be performed by electro-plating of Ni to a thickness of ~1 μm followed by electro-plating of Cu to a thickness of approximately 20 μm. The resulting completed metal stack can thus have sufficiently high electrical conductance to function as front metal fingers with low series resistance power loss. An exemplary solar cell finger created by this large area laser ablation is depicted in FIG. 7; and the self-aligned metallization is shown in FIGS. 8a-b.

One or more of the process control aspects of the present invention can be included in an article of manufacture (e.g., one or more computer program products) having, for instance, computer usable media. The media has embodied therein, for instance, computer readable program code means for providing and facilitating the techniques of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams and steps disclosed herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method comprising:
   forming a conductive contact pattern on a surface of a solar cell, the solar cell comprising a textured semiconductor substrate surface, the forming comprising:
   forming a thin conductive layer over at least one lower layer of the solar cell;
   providing a laser beam having a non-Gaussian top hat beam profile;
   homogenizing the non-Gaussian top hat beam profile, wherein the textured semiconductor substrate surface is configured to facilitate the homogenizing by having a scale comparable to one or more inhomogeneities in the non-Gaussian tot hat beam profile; and
   ablating the entire thin conductive layer from over a portion of the surface using the laser beam having the homogenized non-Gaussian top hat beam profile, thereby leaving behind the conductive contact pattern.

2. The method of claim 1, further comprising forming self-aligned metallization on the conductive contact pattern.

3. The method in accordance with claim 2, wherein a passivation and/or antireflective layer is formed on the surface of the solar cell after said forming said self aligned metallization.

4. The method in accordance with claim 1, wherein the at least one lower layer comprises a passivation and/or antireflective layer beneath the thin conductive layer.

5. The method in accordance with claim 1, wherein the conductive contact pattern forms an electrical contact through the at least one lower layer to a semiconductor layer of the solar cell.

6. The method in accordance with claim 1, further comprising etching or cleaning the conductive contact pattern after said ablating to remove residue, the conductive contact pattern being resistant to said etching or cleaning.

7. The method in accordance with claim 1, wherein the thin conductive layer comprises multiple different thin conductive layers.

8. The method in accordance with claim 1, wherein the providing comprises shaping the laser beam into the non-Gaussian top hat homogeneous beam profile, and the conductive contact pattern comprises a plurality of conductive fingers and a plurality of bus bars interconnected, the plurality of conductive fingers being approximately 50 µms or less.

9. The method in accordance with claim 8, wherein the laser beam is a pulsed laser beam, with the top hat beam profile, processes an area with a single laser pulse, and an overlap of the scanned beam is less than 20% of the single pulse processing area.

10. The method in accordance with claim 1, wherein the laser beam is projected through a mask.

11. The method in accordance with claim 10, wherein a laser beam shape created by the mask is a regular polygon.

12. The method in accordance with claim 10, wherein the laser beam shape created by the mask is the regular polygon obstructed by a thin line running across the polygon.

13. The method in accordance with claim 10, further comprising using multiple mask or a dynamically changing mask.

14. The method in accordance with claim 1, wherein the laser is operated at a wavelength and pulse width at which laser energy is strongly absorbed in the thin layer and weakly absorbed in the at least one lower layer.

15. The method in accordance with claim 1, wherein more than 80% of the surface area of the thin layer is ablated.

16. The method in accordance with claim 1, wherein the pattern remaining after said ablating is in the pattern of contact fingers and/or busbars.

17. A method comprising:
    forming a heterocontact pattern on a solar cell, the solar cell comprising a textured semiconductor substrate surface, the forming comprising:
    forming a thin layer over at least one lower layer of the solar cell;
    providing a laser beam having a non-Gaussian top hat homogeneous beam profile;
    homogenizing the non-Gaussian top hat beam profile, wherein the textured semiconductor substrate surface is configured to facilitate the homogenizing by having a scale comparable to one or more inhomogeneities in the non-Gaussian top hat beam profile; and
    ablating the entire thin layer from over a portion of the surface using the laser beam having the homogenized non-Gaussian top hat beam profile, thereby leaving behind the heterocontact pattern.

18. The method of claim 17, further comprising forming metallization over the heterocontact pattern to facilitate a conductive connection to the at least one lower layer through the heterocontact pattern.

19. The method in accordance with claim 17, wherein the thin layer comprises multiple different layers.

20. The method in accordance with claim 17, further comprising etching the surface of the solar cell after said ablating to form a surface texture and/or to remove any laser ablation damage, the thin film layer being resistant said etching.

21. The method in accordance with claim 17, further comprising modifying said contact pattern by in-situ heat treatment.

22. The method in accordance with claim 17, wherein all or part of the thin layer comprises a doped semiconductor material.

23. The method in accordance with claim 17, wherein all or part of the thin layer comprises a surface passivation layer.

24. The method in accordance with claim 17, wherein the providing comprises shaping the laser beam into the non-Gaussian top hat homogeneous beam profile, and the heterocontact pattern comprises a plurality of conductive fingers and a plurality of bus bars interconnected, the plurality of conductive fingers being approximately 50 μms or less.

25. The method in accordance with claim 24, wherein the laser beam is a pulsed laser beam, with the top hat beam profile, processes an area with a single laser pulse, and an overlap of the scanned beam is less than 20% of the single pulse processing area.

26. The method in accordance with claim 17, wherein the laser beam is projected through a mask.

27. The method in accordance with claim 26, wherein a laser beam shape created by the mask is a regular polygon.

28. The method in accordance with claim 26, wherein the laser beam shape created by the mask is the regular polygon obstructed by a thin line running across the polygon.

29. The method in accordance with claim 26, further comprising using multiple masks or a dynamically changing mask.

30. The method in accordance with claim 17, wherein the laser is operated at a wavelength and pulse width at which laser energy is strongly absorbed in the thin layer and weakly absorbed in the at least one lower layer.

31. The method in accordance with claim 17, wherein more than 80% of the surface area of the thin layer is ablated.

32. The method in accordance with claim 17, wherein the pattern remaining after said ablating is in the pattern of contact fingers and/or busbars.

* * * * *